United States Patent
Wu et al.

(10) Patent No.: US 9,994,681 B2
(45) Date of Patent: Jun. 12, 2018

(54) ORGANOPOLYSILOXANE PREPOLYMER AND A CURABLE ORGANOPOLYSILOXANE COMPOSITION COMPRISING THE SAME

(71) Applicant: Henkel AG & Co. KGaA, Duesseldorf (DE)

(72) Inventors: Hao Wu, Shanghai (CN); Wenjuan Tan, Shanghai (CN); Wentao Xing, Shanghai (CN); Yong Zhang, Shanghai (CN); Mieko Sano, Yokohama (JP); Aya Hikita, Kanagawa (JP); Tadashi Takano, Irvine, CA (US); Liwei Zhang, Shanghai (CN); Carol Yang, Shanghai (CN); Zhiming Li, Shanghai (CN); Juan Du, Shanghai (CN)

(73) Assignee: Henkel AG & Co. KGaA, Dusseldorf (DE)

( * ) Notice: Subject to any disclaimer, the term of this patent is extended or adjusted under 35 U.S.C. 154(b) by 0 days. days.

(21) Appl. No.: 15/647,648

(22) Filed: Jul. 12, 2017

(65) Prior Publication Data

US 2017/0306100 A1    Oct. 26, 2017

Related U.S. Application Data

(63) Continuation of application No. PCT/CN2015/070578, filed on Jan. 13, 2015.

(51) Int. Cl.
| | |
|---|---|
| *C08G 77/20* | (2006.01) |
| *C08G 77/12* | (2006.01) |
| *C08K 5/3477* | (2006.01) |
| *C08G 77/08* | (2006.01) |

(52) U.S. Cl.
CPC ............ *C08G 77/20* (2013.01); *C08G 77/08* (2013.01); *C08G 77/12* (2013.01); *C08K 5/3477* (2013.01)

(58) Field of Classification Search
None
See application file for complete search history.

(56) References Cited

U.S. PATENT DOCUMENTS

| | | | | |
|---|---|---|---|---|
| 3,892,643 A | * | 7/1975 | Tanaka | C07F 7/0854 522/137 |
| 4,374,986 A | * | 2/1983 | Renner | C07D 251/34 544/221 |
| 5,101,029 A | * | 3/1992 | Stapp | C07F 7/0854 544/221 |
| 5,204,408 A | * | 4/1993 | Konno | C08F 8/42 525/105 |
| 7,560,145 B2 | * | 7/2009 | Ouchi | C08G 77/485 428/1.1 |
| 8,124,715 B2 | * | 2/2012 | Tanaka | C07F 7/0854 528/32 |
| 8,273,842 B2 | * | 9/2012 | Ichiryu | C07F 7/0874 525/477 |
| 2012/0123054 A1 | | 5/2012 | Matsumoto et al. | |

FOREIGN PATENT DOCUMENTS

| | | |
|---|---|---|
| JP | 2005068268 A | 3/2005 |
| JP | 2007009041 A | 1/2007 |
| JP | 2009019140 A | 1/2009 |
| JP | 2009270101 A | 11/2009 |
| JP | 2010100758 A | 5/2010 |
| WO | 2006057218 A1 | 6/2006 |
| WO | 2011007789 A1 | 1/2011 |

OTHER PUBLICATIONS

International Search Report for International PCT Patent Application No. PCT/CN2015/070578 dated Sep. 24, 2015.

* cited by examiner

*Primary Examiner* — Robert S Loewe
(74) *Attorney, Agent, or Firm* — James E. Piotrowski

(57) ABSTRACT

The present invention discloses an organopolysiloxane prepolymer and a curable organopolysiloxane composition comprising the same, particularly used as an encapsulant in light emitting diodes.

13 Claims, No Drawings

ORGANOPOLYSILOXANE PREPOLYMER AND A CURABLE ORGANOPOLYSILOXANE COMPOSITION COMPRISING THE SAME

TECHNICAL FIELD

The present invention relates to an organopolysiloxane prepolymer and a curable organopolysiloxane composition comprising the same, particularly used as an encapsulant in light emitting diode (LED) devices.

BACKGROUND

An encapsulant is usually used in light emitting materials, for example LEDs for encasing the light emitting elements, for example a diode which connects with chips. During the operation of manufacturing LEDs, especially dry reflow, a rapid rise in temperature occurs, subjecting the encapsulant to thermal shock. In addition, when the LED is turned on and off repeatedly, the encapsulant is exposed to temperature cycles. In addition to normal use, LEDs are also exposed to environmental changes in temperature and humidity, as well as subject to physical shocks. Therefore, optimal performance of the encapsulant for LEDs is required.

Previously, epoxy resins were used as encapsulant for LEDs since they show good mechanical properties. However, epoxy resins easily show yellowing under UV/thermal condition. Silicone materials were further developed for replacing epoxy resins as the encapsulant in LEDs.

For example, JP 2005068268 A discloses a curable composition for optical materials, comprising:
an organopolysiloxane having an alkenyl group and a phenyl group;
an isocyanurate compound having an alkenyl group;
an organohydrogensiloxane having at least four SiH bonds in one molecule;
an organosiloxane having a phenyl group and two or three SiH bonds in one molecule; and
a hydrosilylation catalyst.

JP 2010100758 A disclose a silicone composition comprising:
(A) a compound having two or more Si—H groups in the molecule;
(B) a prepolymer having two or more carbon-carbon double bonds; and
(C) a hydrosilylation catalyst.

JP 2009270101 A discloses a silicone composition comprising:
(A) a polyorganosiloxane having more than two alkenyl groups;
(B) a polyorganohydrogensiloxane containing reaction product of organosiloxane oligomer having more than two SiH groups with isocyanurate having at least one alkenyl group,
(C) hydrosilylation catalyst and/or radical initiator.

In addition, WO 2011007789 A discloses a silicone composition comprising:
(A) an organic compound having a number-average molecular weight of 10,000 or lower and having, per molecule, at least two carbon-carbon double bonds reactive with an SiH group,
(B) a polysiloxane compound which contains at least two SiH groups per molecule,
(C) a hydrosilylation catalyst, and
(D) a silicone compound which has a structure represented by the general formula $R^1{}_n SiO_{(4-n)/2}$.

Silicone compositions generally show better heat stability and light stability than those of epoxy resins. However, the mechanical properties of silicone materials are usually weak and thus these materials tend to crack and delaminate when used as the encapsulant in LED devices, such as LED cups.

There is a need for silicone materials, which have both, good thermal resistance and good mechanical properties for LED application.

SUMMARY OF THE INVENTION

One aspect of the present invention is an organopolysiloxane prepolymer, being a reaction product of reactants comprising:

(a) a cyclic isocyanurate having two or more ethylenically unsaturated double bonds which is represented by formula (1)

a.

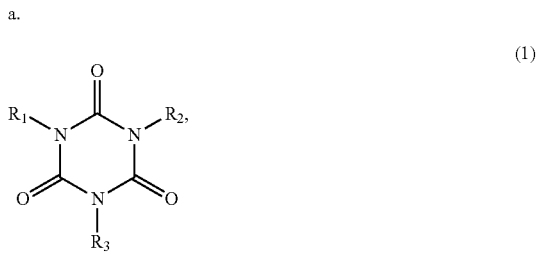

(1)

wherein $R^1$, $R^2$ and $R^3$ independently from each other represent an alkyl group having from 1 to 20 carbon atoms, an aromatic group having from 6 to 20 carbon atoms, a monovalent organic group represented by $—(CH_2)_m—X$ or $—(CH_2)_p—O—(CH_2)_q—Y$, in which m is from 0 to 3, p is from 0 to 3, q is from 0 to 3, X and Y are selected from the group consisting of an alkenyl group having from 2 to 20 carbon atoms, an epoxy group having from 2 to 20 carbon atoms, and an trialkoxysilyl group having from 1 to 20 carbon atoms independently for each alkoxy group, and at least two of $R^1$, $R^2$ and $R^3$ contain an ethylenically unsaturated double bond, (b) a linear organohydrogensiloxane having at least one hydrogen atom directly bonded to a silicon atom in one molecule, represented by the average compositional formula (2):

b. $(R^4R^5R^6SiO_{1/2})_a(R^7R^8SiO_{2/2})_b$ (2), wherein at least one of $R^4$ to $R^8$ is a hydrogen atom directly bonded to a silicon atom, at least one of $R^4$ to $R^8$ is an aromatic group having from 6 to 20 carbon atoms, the others of $R^4$ to $R^8$ independently from each other represent an alkyl group having from 1 to 20 carbon atoms or an alkoxy group having from 1 to 20 carbon atoms, a is from 0.1 to 0.9, b is from 0.1 to 0.9, and the sum of a+b is 1; and (c) a hydrosilylation catalyst (I), wherein the molar ratio of the ethylenically unsaturated double bonds contained in component (a) to the hydrogen atom directly bonded to a silicon atom contained in component (b) is from 2.2 to 5.0.

Another aspect is a curable organopolysiloxane composition, comprising:
(a) the organopolysiloxane prepolymer according to the present invention,
(b) an organopolysiloxane comprising at least two ethylenically unsaturated double bonds in one molecule represented by the average compositional formula (3):

1. $(R^9R^{10}R^{11}SiO_{1/2})c(R^{12}SiO_{3/2})d(SiO_{4/2})e$     (3), wherein
at least one of $R^9$ to $R^{12}$ is an alkenyl group having from 2 to 20 carbon atoms, at least one of $R^9$ to $R^{12}$ is an aromatic group having from 6 to 20 carbon atoms, the others of $R^9$ to $R^{12}$ independently from each other represent an alkyl group having from 1 to 20 carbon atoms or an alkoxy group having from 1 to 20 carbon atoms, from 15 to 65 mol % of $R^9$ to $R^{12}$ in one molecule of the organopolysiloxane are an aromatic group having from 6 to 20 carbon atoms, from 1 to 50 mol % of $R^9$ to $R^{12}$ in one molecule of the organopolysiloxane are an alkenyl group having from 2 to 20 carbon atoms, and the total mol % of $R^9$ to $R^{12}$ in one molecule of the organopolysiloxane is 100 mol %,
c is from 0.1 to 0.8, d is from 0.2 to 0.9, e is from 0 to 0.2, and the sum of c+d+e is 1,
(c) a branched polyorganohydrogensiloxane having 1 to 3 hydrogen atoms directly bonded to a silicon atom in one molecule represented by the average compositional formula (4):

2. $(R^{13}R^{14}R^{15}SiO_{1/2})f(R^{16}SiO_{3/2})g(SiO_{4/2})h$     (4), wherein
at least one of $R^{13}$ to $R^{16}$ is a hydrogen atom directly bonded to a silicon atom, at least one of $R^{13}$ to $R^{16}$ is an aromatic group having from 6 to 20 carbon atoms, the others of $R^{13}$ to $R^{16}$ independently from each other represent an alkyl group having from 1 to 20 carbon atoms or an alkoxy group having from 1 to 20 carbon atoms,
f is from 0.1 to 0.8, g is from 0.2 to 0.9, h is from 0 to 0.5, and the sum of f+g+h is 1;
(d) a linear organohydrogensiloxane having at least one hydrogen atom directly bonded to a silicon atom in one molecule, represented by the average compositional formula (5):

a. $(R^{17}R^{18}R^{19}SiO_{1/2})i(R^{20}R^{21}SiO_{2/2})j$     (5), wherein
at least one of $R^{17}$ to $R^{21}$ is a hydrogen atom directly bonded a silicon atom, at least one of $R^{17}$ to $R^{21}$ is an aromatic group having from 6 to 20 carbon atoms, the others of $R^{17}$ to $R^{21}$ independently from each other represent an alkyl group having from 1 to 20 carbon atoms or an alkoxy group having from 1 to 20 carbon atoms,
i is from 0.1 to 0.9, j is from 0.1 to 0.9, and the sum of i+j is 1, and
(e) a hydrosilylation catalyst (II).

Yet another aspect is a cured product of the curable organopolysiloxane composition according to the present invention.

Yet another aspect is the use of the cured product according to the present invention as an encapsulant for light emitting materials.

Yet another aspect is the use of the organopolysiloxane prepolymer according to the present invention, the curable organopolysiloxane composition according to the present invention, or the cured product according to the present invention in the manufacturing of optical devices.

Other features and aspects of the subject matter are set forth in greater detail below.

DETAILED DESCRIPTION

It is to be understood by one of ordinary skill in the art that the present discussion is a description of exemplary embodiments only, and is not intended as limiting the broader aspects of the present invention.

The Organopolysiloxane Prepolymer

In one aspect, the present disclosure is generally directed to an organopolysiloxane prepolymer, being a reaction product of reactants comprising:
(a) a cyclic isocyanurate having two or more ethylenically unsaturated double bonds which is represented by formula (1)

a.

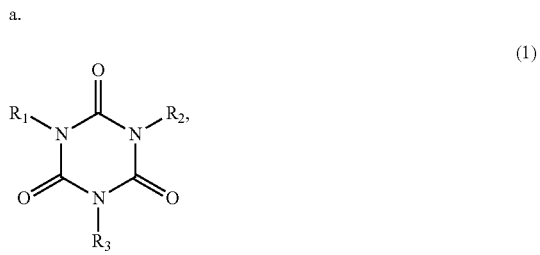

(1)

wherein
$R^1$, $R^2$ and $R^3$ independently from each other represent an alkyl group having from 1 to 20 carbon atoms, an aromatic group having from 6 to 20 carbon atoms, a monovalent organic group represented by $—(CH_2)_m—X$ or $—(CH_2)_p—O—(CH_2)_q—Y$, in which m is from 0 to 3, p is from 0 to 3, q is from 0 to 3, X and Y are selected from the group consisting of an alkenyl group having from 2 to 20 carbon atoms, an epoxy group having from 2 to 20 carbon atoms, and an trialkoxysilyl group having from 1 to 20 carbon atoms independently for each alkoxy group, and at least two of $R^1$, $R^2$ and $R^3$ contain an ethylenically unsaturated double bond,
(b) a linear organohydrogensiloxane having at least one hydrogen atom directly bonded to a silicon atom in one molecule, represented by the average compositional formula (2):

b. $(R^4R^5R^6SiO_{1/2})_a(R^7R^8SiO_{2/2})_b$     (2), wherein
at least one of $R^4$ to $R^8$ is a hydrogen atom directly bonded to a silicon atom, at least one of $R^4$ to $R^8$ is an aromatic group having from 6 to 20 carbon atoms, the others of $R^4$ to $R^8$ independently from each other represent an alkyl group having from 1 to 20 carbon atoms or an alkoxy group having from 1 to 20 carbon atoms, a is from 0.1 to 0.9, b is from 0.1 to 0.9, and the sum of a+b is 1; and
(c) a hydrosilylation catalyst (I),
wherein the molar ratio of the ethylenically unsaturated double bonds contained in component (a) to the hydrogen atom directly bonded to a silicon atom contained in component (b) is from 2.2 to 5.0.

As used herein, "an alkyl group having from 1 to 20 carbon atoms" refers to a linear or branched moiety containing only single bonds between carbon atoms in the moiety and including, for example, $C_1$-$C_{18}$-, $C_1$-$C_{12}$-, $C_1$-$C_{10}$-, $C_1$-$C_8$-, $C_1$-$C_6$- or $C_1$-$C_4$-alkyl. Examples thereof are methyl, ethyl, propyl, isopropyl, n-butyl, sec-butyl, isobutyl, tert-butyl, pentyl, hexyl, heptyl, 2,4,4-trimethylpentyl, 2-ethylhexyl, octyl, nonyl, decyl, undecyl, dodecyl, hexadecyl, octadecyl and eicosyl.

As used herein, "an alkenyl group having from 2 to 20 carbon atoms" refers to a straight or branched chain hydrocarbon having from two to twenty carbon atoms, with at least one unsaturation, and including, for example, $C_2$-$C_{18}$-, $C_2$-$C_{12}$-, $C_2$-$C_{10}$-, $C_2$-$C_8$-, $C_2$-$C_6$- or $C_2$-$C_4$-alkenyl. Typical alkenyl groups having from 2 to 20 carbon atoms are groups such as vinyl, allyl, 1-propen-2-yl, 1-buten-4-yl, 2-buten-4-yl and 1-penten-5-yl.

As used herein, "an alkoxy group having from 1 to 20 carbon atoms" refers to the group —O—R where R is an alkyl having from 1 to 20 carbon atoms as defined above.

As used herein, "an aromatic group having from 6 to 20 carbon atoms" refers to an unsaturated aromatic carbocyclic group of from 6 to 20 carbon atoms having a single ring (e.g., phenyl) or multiple condensed (fused) rings, wherein at least one ring is aromatic (e.g., naphthyl, dihydrophenanthrenyl, fluorenyl, or anthryl). Preferred aromatic groups include phenyl, naphthyl and the like.

As used herein, the above groups may be further substituted or unsubstituted. When substituted, hydrogen atoms on the groups are replaced by substituent group(s) that is(are) one or more group(s) independently selected from alkyl, alkenyl, alkynyl, cycloalkyl, cycloalkenyl, cycloalkynyl, aryl, heteroaryl, heteroalicyclyl, aralkyl, heteroaralkyl, (heteroalicyclyl)alkyl, hydroxy, protected hydroxyl, alkoxy, aryloxy, acyl, ester, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, protected C-carboxy, O-carboxy, isocyanato, thiocyanato, isothiocyanato, nitro, silyl, sulfenyl, sulfinyl, sulfonyl, haloalkyl, haloalkoxy, trihalomethanesulfonyl, trihalomethanesulfonamido, and amino, including mono- and di-substituted amino groups, and the protected derivatives thereof. In case that an aryl is substituted, substituents on an aryl group may form a non-aromatic ring fused to the aryl group, including a cycloalkyl, cycloalkenyl, cycloalkynyl, and heterocyclyl.

As used herein, the structures of the average compositional formulae (2) to (5) represent that each of the reactants and components can be identified with reference to certain units contained in a siloxane structure. These units have been designated as M, D, T and/or Q units, which represent, respectively, units with the empirical formulae $R^aR^bR^c SiO_{1/2}$, $R^dR^eSiO_{2/2}$, $R^fSiO_{3/2}$ and $SO_{4/2}$. The letter designations M, D, T or Q refer respectively, to the fact that the unit is monofunctional, difunctional, trifunctional or tetrafunctional. The units of M, D, T and Q are arranged randomly or in blocks. For example, blocks of units of M, D, T and Q may follow one another, but the individual units may also be linked in random distribution, depending upon the polyorganosiloxane used during preparation.

Reactant (a)

In the present invention, reactant (a) is a cyclic isocyanurate having two or more ethylenically unsaturated double bonds, which is represented by formula (1).

In the reactant (a), $R^1$, $R^2$ and $R^3$ independently from each other represent an alkyl group having from 1 to 20, preferably 1 to 12, more preferably 1 to 6 carbon atoms, an aromatic group having from 6 to 20, preferably 6 to 12 carbon atoms, a monovalent organic group represented by —$(CH_2)_m$—X or —$(CH_2)_p$—O—$(CH_2)_q$—Y, in which m is from 0 to 3, p is from 0 to 3, q is from 0 to 3, X and Y are selected from the group consisting of an alkenyl group having from 2 to 20, preferably 2 to 12, more preferably 2 to 8 carbon atoms, an epoxy group having from 2 to 20, preferably 2 to 12, more preferably 2 to 8 carbon atoms, and an alkoxysilyl group having from 1 to 20, preferably 1 to 12, more preferably 1 to 8 carbon atoms.

The alkyl group for $R^1$, $R^2$ and $R^3$ is preferably selected from the group consisting of methyl, ethyl, propyl, isopropyl, n-butyl, sec-butyl, isobutyl, tert-butyl, pentyl, hexyl, heptyl, 2,4,4-trimethylpentyl, 2-ethylhexyl, and octyl; the alkenyl group is preferably selected from the group consisting of vinyl, allyl, methallyl, 1,1-dimethylallyl, 1-butenyl, 2-butenyl, 1,3-pentadienyl, 1-hexenyl and 1-octenyl. The epoxy group for $R^1$, $R^2$ and $R^3$ is preferably selected from the group consisting of glycidoxyethyl, glycidoxypropyl, glycidoxybutyl, 3,4-epoxycyclohexylethyl, 3,4-epoxycyclohexylpropyl, 3,4-epoxynorbornenylethyl, 2-(3,4-epoxy-3-methylcyclohexyl)-2-methylethyl. The trialkoxysilyl group for $R^1$, $R^2$ and $R^3$ is preferably selected from the group consisting of trimethoxysilyl, triethoxysilyl, tripropoxysilyl, triisopropoxysilyl, tricyclopropyloxysilyl, tricyclohexyloxysilyl, dimethoxyethoxysilyl, and methoxydiethoxysilyl.

Especially preferred are the following compounds:

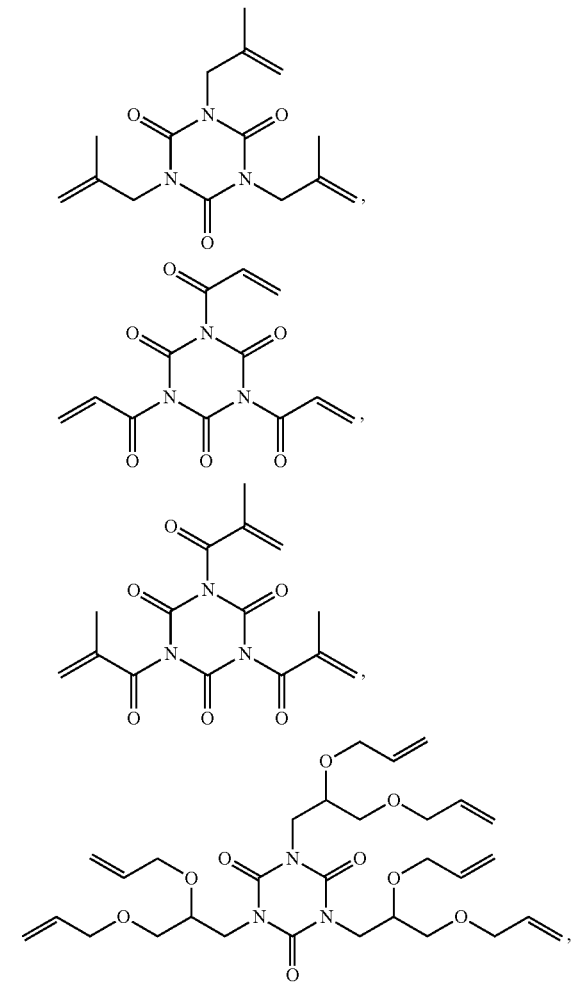

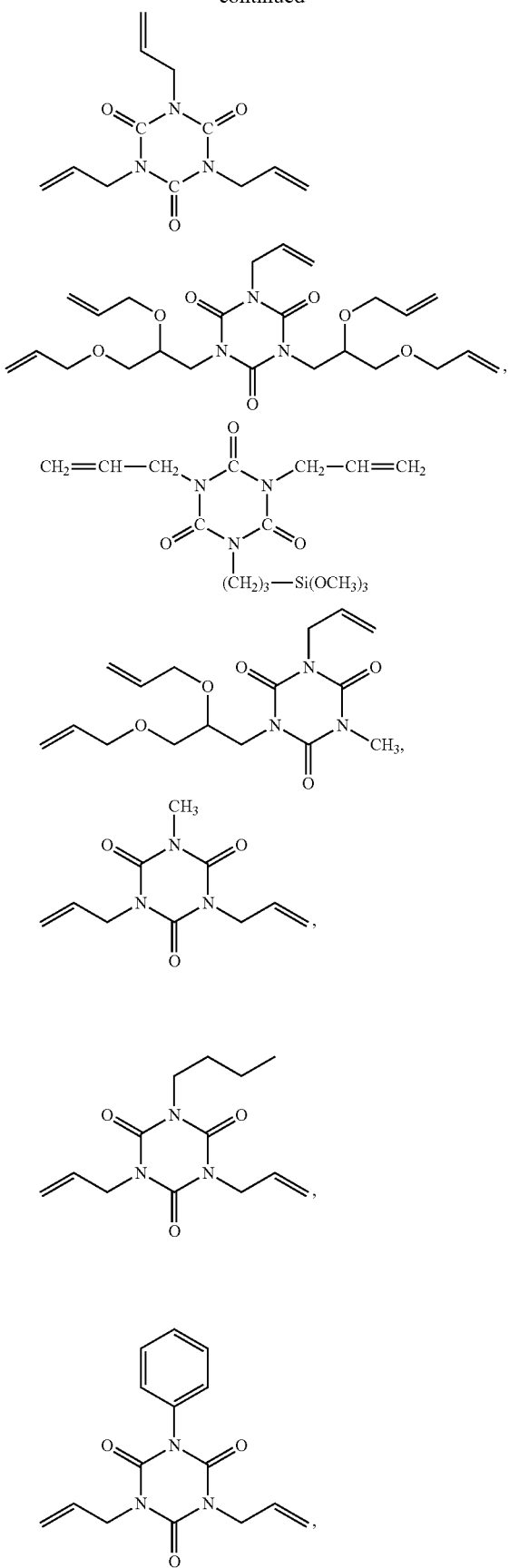

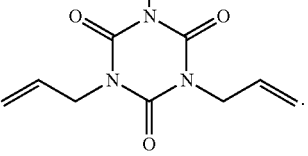

Among the above, unsaturated cyclic isocyanurates, triallyl isocyanurate and diallyl monoglycidyl isocyanurate are more preferable to be used in the present invention.

In the organopolysiloxane prepolymer, the reactant (a) is present in an amount of from 40 to 75%, preferably from 45 to 70% by weight of the total amount of all reactants.

Reactant (b)

In the linear organohydrogensiloxane, at least one of $R^4$ to $R^8$ is a hydrogen atom directly bonded to a silicon atom, at least one of $R^4$ to $R^8$ is an aromatic group having from 6 to 20 carbon atoms, preferably from 6 to 14 carbon atoms, more preferably phenyl, the others of $R^4$ to $R^8$ independently from each other represent an alkyl group having from 1 to 20 carbon atoms, preferably from 1 to 8 carbon atoms, and more preferably from 1 to 4 carbon atoms, such as methyl, ethyl, n-propyl, and n-butyl, or represent an alkoxy group having from 1 to 20 carbon atoms, preferably from 1 to 8 carbon atoms, and more preferably from 1 to 4 carbon atoms, such as methoxy, ethoxy, n-propoxy, and n-butoxy.

In one embodiment, the index a in the general formula of the reactant (b) is from 0.2 to 0.8, b is from 0.2 to 0.8, and the sum of a+b is 1.

Preferably, the reactant (b) is selected from the group consisting of
1,3-dimethyl-1,3-diphenyl-disiloxane,
3-(dimethylvinylsiloxy)-1,1,5,5-tetramethyl-3-phenyltrisiloxane,
3-(dimethylvinylsiloxy)-1,1,5,5-tetramethyl-3-methyltrisiloxane,
1,1,3,3-tetramethyl-disiloxane, 1,1,5,5-tetramethyl-3,3-diphenyltrisiloxane,
1,1,7,7-tetramethyl-3,5-diphenyltetrasiloxane,
1,1,9,9-tetramethyl-3,5,7-triphenylpentasiloxane,
1,1,11,11-tetramethyl-3,5,7,9-tetraphenylhexasiloxane,
1,1,3,3,5,5,7,7-octamethyltetrasiloxane, 1,1,3,3-tetramethyldisiloxane, and combination thereof.

In the organopolysiloxane prepolymer, the reactant (b) is present in an amount of from 25 to 60%, preferably from 30 to 55% by weight of the total amount of all reactants.

In one embodiment, the molar ratio of the ethylenically unsaturated double bonds contained/in component (a) to the hydrogen atom directly bonded to a silicon atom contained in component (b) is from 2.2 to 5.0, preferably from 2.3 to 4.5, more preferably from 2.4 to 4.0.

While not wishing to be limited by theory, the molar ratio of the ethylenically unsaturated double bonds contained in component (a) to the hydrogen atom directly bonded to a silicon atom contained in component (b) is important to impart an excellent mechanical property to the product of the curable composition according to the present invention as will be detailed described below. If the molar ratio is smaller than 2.2 or even about 1.0, the polyorganosiloxane prepolymer may have a larger viscosity which results in a poor workability. In addition, an excessively lower molar ratio may deteriorate the mechanical properties of the final product, e.g. encapsulant used in LEDs. For example, if the molar ratio is larger than 5.0, the excessive amount of monomer will increase the risk of crack and delamination of the encapsulant after dry reflow operation.

Hydrosilylation Catalyst (I)

Hydrosilylation catalyst is known to add in the reaction for the organopolysiloxane prepolymer according to the present invention, all catalysts which are useful for the addition of Si-bonded hydrogen onto aliphatically unsaturated compounds can be used as the hydrosilylation catalyst (I). Examples of such catalysts are compounds or complexes of precious metals comprising platinum, ruthenium, iridium, rhodium and palladium, such as, for example, platinum halides, platinum-olefin complexes, platinum-alcohol complexes, platinum-alcoholate complexes, platinum-ether complexes, platinum-aldehyde complexes, platinum-ketone complexes, including reaction products of $H_2PtCl_6 \cdot 6H_2O$ and cyclohexanone, platinum-vinylsiloxane complexes, in particular platinum-divinyltetramethyldisiloxane complexes with or without a content of detectable inorganically bonded halogen, bis(γ-picolin)-platinum dichloride, trimethylenedipyridine-platinum dichloride, dicyclopentadiene-platinum dichloride, dimethylsulfoxide ethylene-platinum(II) dichloride and also reaction products of platinum tetrachloride with olefin and primary amine or secondary amine or primary and secondary amine, such as, for example, the reaction product of platinum tetrachloride dissolved in 1-octene with sec-butylamine. In addition, complexes of iridium with cyclooctadienes, such as, for example, μ-dichlorobis(cyclooctadiene)-diiridium(I), can also be used in the present invention.

Preferably, the hydrosilylation catalyst (I) is a compound or complex of platinum, preferably selected from the group consisting of chloroplatinic acid, allylsiloxane-platinum complex catalyst, supported platinum catalysts, methylvinylsiloxane-platinum complex catalysts, reaction products of dicarbonyldichloroplatinum and 2,4,6-triethyl-2,4,6-trimethylcyclotrisiloxane, platinum divinyltetramethyldisiloxane complex, and the combination thereof, and most preferably platinum-divinyltetramethyldisiloxane complexes.

The hydrosilylation catalyst (I) is used for preparing the organopolysiloxane prepolymer according to the present invention in an amount of 1 to 500 ppm, and preferably 2 to 100 ppm, calculated as the elemental precious metal, based on the total weight of all reactants.

In one preferred embodiment, the organopolysiloxane prepolymer is a reaction product of reactants comprising:
a) from 40 to 75%, preferably 45 to 70% by weight of reactant (a),
b) from 25 to 60%, preferably 30 to 55% by weight of reactant (b), and
c) from 1 to 500 ppm, preferably 2 to 100 ppm of the hydrosilylation catalyst (I) calculated as the elemental precious metal contained therein,
wherein the percentages by weight and ppm are based on the total weight of all reactants.

In another preferred embodiment, the organopolysiloxane prepolymer has a Brookfield viscosity of from about 5 to 200 Pas, preferably about 20 to 100 measured at 25° C. using a Brookfield DV2T digital viscometer with a spindle CPA-52Z at 1 rpm.

The Curable Organopolysiloxane Composition

Another aspect is directed to a curable organopolysiloxane composition, comprising:
(a) the organopolysiloxane prepolymer according to present invention,
(b) an organopolysiloxane comprising at least two ethylenically unsaturated double bonds in one molecule represented by the average compositional formula (3):

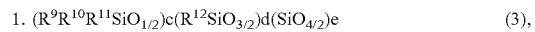

1. $(R^9R^{10}R^{11}SiO_{1/2})c(R^{12}SiO_{3/2})d(SiO_{4/2})e$ (3), wherein at least one of $R^9$ to $R^{12}$ is an alkenyl group having from 2 to 20 carbon atoms, at least one of $R^9$ to $R^{12}$ is an aromatic group having from 6 to 20 carbon atoms, the others of $R^9$ to $R^{12}$ independently from each other represent an alkyl group having from 1 to 20 carbon atoms or an alkoxy group having from 1 to 20 carbon atoms, from 15 to 65 mol % of $R^9$ to $R^{12}$ in one molecule of the organopolysiloxane are an aromatic group having from 6 to 20 carbon atoms, from 1 to 50 mol % of $R^9$ to $R^{12}$ in one molecule of the organopolysiloxane are an alkenyl group having from 2 to 20 carbon atoms, and the total mol % of $R^9$ to $R^{12}$ in one molecule of the organopolysiloxane is 100 mol %, c is from 0.1 to 0.8, d is from 0.2 to 0.9, e is from 0 to 0.2, and the sum of c+d+e is 1, (c) a branched polyorganohydrogensiloxane having 1 to 3 hydrogen atoms directly bonded to a silicon atom in one molecule represented by the average compositional formula (4):

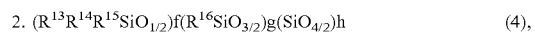

2. $(R^{13}R^{14}R^{15}SiO_{1/2})f(R^{16}SiO_{3/2})g(SiO_{4/2})h$ (4), wherein at least one of $R^{13}$ to $R^{16}$ is a hydrogen atom directly bonded to a silicon atom, at least one of $R^{13}$ to $R^{16}$ is an aromatic group having from 6 to 20 carbon atoms, the others of $R^{13}$ to $R^{16}$ independently from each other represent an alkyl group having from 1 to 20 carbon atoms or an alkoxy group having from 1 to 20 carbon atoms, f is from 0.1 to 0.8, g is from 0.2 to 0.9, h is from 0 to 0.5, and the sum of f+g+h is (d) a linear organohydrogensiloxane having at least one hydrogen atom directly bonded to a silicon atom in one molecule, represented by the average compositional formula (5):

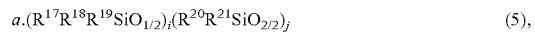

$a.(R^{17}R^{18}R^{19}SiO_{1/2})i(R^{20}R^{21}SiO_{2/2})j$ (5), wherein at least one of $R^{17}$ to $R^{21}$ is a hydrogen atom directly bonded to a silicon atom, at least one of $R^{17}$ to $R^{21}$ is an aromatic group having from 6 to 20 carbon atoms, the others of $R^{17}$ to $R^{21}$ independently from each other represent an alkyl group having from 1 to 20 carbon atoms or an alkoxy group having from 1 to 20 carbon atoms, i is from 0.1 to 0.9, j is from 0.1 to 0.9, and the sum of i+j is 1, and (e) a hydrosilylation catalyst (II).

Component (a)

The component (a) contained in the organopolysiloxane composition is the organopolysiloxane prepolymer as discussed above.

The component (a) is preferably present in an amount of from 1 to 60%, more preferably 3 to 50% by weight of the total weight of all components.

Component (b)

The component (b) in the curable organopolysiloxane composition is an organopolysiloxane comprising at least two ethylenically unsaturated double bonds in one molecule represented by the average compositional formula (3):

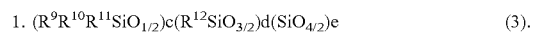

1. $(R^9R^{10}R^{11}SiO_{1/2})c(R^{12}SiO_{3/2})d(SiO_{4/2})e$ (3).

In the curable organopolysiloxane composition according to the present invention, at least one of $R^9$ to $R^{12}$ in the component (b) is an alkenyl group having from 2 to 20, preferably from 2 to 8 carbon atoms, at least one of $R^9$ to $R^{12}$ is an aromatic group having from 6 to 20 carbon atoms, preferably from 6 to 14 carbon atoms, and the others of $R^9$ to $R^{12}$ independently from each other represent an alkyl group having from 1 to 20 carbon atoms, preferably from 1 to 8 carbon atoms or an alkoxy group having from 1 to 20 carbon atoms, preferably from 1 to 8 carbon atoms.

Preferably, the alkenyl group for $R^9$ to $R^{12}$ is selected from the group consisting of vinyl, allyl, methallyl, 1,1-dimethylallyl, 1-butenyl, 2-butenyl, 1,3-pentadienyl, 1-hexenyl and 1-octenyl. The alkyl group for $R^9$ to $R^{12}$ is selected from the group consisting of methyl, ethyl, propyl, isopropyl, n-butyl, sec-butyl, isobutyl, tert-butyl, pentyl, hexyl, heptyl, 2,4,4-trimethylpentyl, 2-ethylhexyl, and octyl. The alkoxyl group for $R^9$ to $R^{12}$ is selected from the group consisting of methoxy, ethoxy, propoxy, isopropoxy, cyclopropyloxy, and cyclohexyloxy. The aromatic group for $R^9$ to $R^{12}$ is selected from the group consisting of phenyl, biphenyl, 1,2,3,4-tetrahydronaphthyl, naphthyl, anthryl, phenanthryl, and 9-fluorenyl.

In one molecule of the component (b) of the curable organopolysiloxane composition, from 20 to 50 mol % of $R^9$ to $R^{12}$ is an aromatic group having from 6 to 20 carbon atoms, preferably aromatic group having from 6 to 14 carbon atoms, and more preferably phenyl. From 5 to 30 mol % of $R^9$ to $R^{12}$ in one molecule of component (b) is alkenyl group having from 2 to 20 carbon atoms, preferably alkenyl group having from 2 to 8 carbon atoms, and more preferably vinyl or allyl.

In the component (b) of the curable organopolysiloxane composition according to the present invention, c is preferably from 0.2 to 0.6, d is preferably from 0.3 to 0.8, more preferably from 0.4 to 0.7, e is preferably from 0 to 0.1, and the sum of c+d+e is 1.

The component (b) of the present curable organopolysiloxane may be produced by the condensation reaction of at least one aromatic alkoxysilane, at least one alkenyl alkoxysilane, and optionally a hydride terminated polydimethylsiloxane.

The aromatic group in the aromatic alkoxysilane may have from 6 to 20 carbon atoms, preferably from 6 to 12 carbon atoms. The alkenyl group in the alkenyl alkoxysilane may have from 2 to 20 carbon atoms, preferably from 2 to 12 carbon atoms. The alkoxy group in the aromatic alkoxysilane and alkenyl alkoxysilane may have from 2 to 20 carbon atoms, preferably from 2 to 12 carbon atoms.

The aromatic alkoxysilane may be exemplified by phenyltrimethoxysilane, diphenyldimethoxysilane, triphenylmethoxysilane, phenyltriethoxysilane, diphenyldiethoxysilane, triphenylethoxysilane, phenyldimethoxymethylsilane, phenylmethoxydimethylsilane, diphenylmethoxymethylsilane, phenyldimethoxyethylsilane, phenylmethoxydiethylsilane, and diphenylmethoxyethylsilane.

The alkenyl alkoxysilane may be exemplified by vinyltrimethoxysilane, divinyldimethoxysilane, trivinylmethoxysilane, vinyltriethoxysilane, divinyldiethoxysilane, trivinylethoxysilane, vinyldimethoxymethylsilane, vinylmethoxydimethylsilane, divinylmethoxymethylsilane, vinyldimethoxyethylsi lane, vinylmethoxydiethylsilane, divinylmethoxyethylsi lane, vinyldiethoxymethylsilane, vinylethoxydimethylsilane, divinylethoxymethylsilane, vinyldiethoxyethylsilane, vinylethoxydiethylsilane, divinylethoxydiethylsilane, allyltrimethoxysilane, diallyldimethoxysilane, triallylmethoxysilane, allyltriethoxysilane, diallyldiethoxysilane, triallylethoxysilane, allyldimethoxymethylsilane, allylmethoxydimethylsilane, diallylmethoxymethylsilane, allyldimethoxyethylsilane, allylmethoxydiethylsilane, diallylmethoxyethylsilane, allyldiethoxymethylsilane, allylethoxydimethylsilane, diallylethoxymethylsilane, allyldiethoxyethylsilane, allylethoxydiethylsilane, and diallylethoxydiethylsilane.

In addition, other aromatic alkoxysilane and alkenyl alkoxysilane having higher alkoxy, for example, propoxy, butoxy, hexoxy, and octoxy also can be used in the present invention.

The hydride terminated polydimethylsiloxane may be exemplified by hexamethyldisiloxane, octamethyltrisiloxane, decamethyltetrasiloxane, dodecamethylpenta-siloxane, and tetradecamethylhexasiloxane.

In one particular embodiment, the component (b) of the organopolysiloxane prepolymer according to the present invention is a vinyl phenyl silicone resin produced by the reaction of a phenyltrimethoxysilane and a vinyldimethylethoxysilane in acidic condition or the reaction of a phenyltrimethoxysilane, a vinyldimethylethoxysilane and a hydride terminated polydimethylsiloxane in acidic condition.

The component (b) is preferably present in an amount of from 0.5 to 75%, more preferably from 1 to 70% by weight of the total weight of all components.

Component (c)

The component (c) of the curable organopolysiloxane composition is a branched polyorganohydrogensiloxane having 1 to 3 hydrogen atoms directly bonded to a silicon atom in one molecule represented by the average compositional formula (4):

1. $(R^{13}R^{14}R^{15}SiO_{1/2})_f(R^{16}SiO_{3/2})_g(SiO_{4/2})_h$         (4).

In the curable organopolysiloxane composition according to the present invention, at least one of $R^{13}$ to $R^{16}$ in the component (c) is a hydrogen atom directly bonded to a silicon atom, at least one of $R^{13}$ to $R^{16}$ is an aromatic group having from 6 to 20 carbon atoms, preferably from 6 to 14 carbon atoms, and the others of $R^{13}$ to $R^{16}$ independently from each other represent an alkyl group having from 1 to 20 carbon atoms, preferably from 1 to 8 carbon atoms or an alkoxy group having from 1 to 20 carbon atoms, preferably from 1 to 8 carbon atoms.

Preferably, the alkyl group for $R^{13}$ to $R^{16}$ is selected from the group consisting of methyl, ethyl, propyl, isopropyl, n-butyl, sec-butyl, isobutyl, tert-butyl, pentyl, hexyl, heptyl, 2,4,4-trimethylpentyl, 2-ethylhexyl, and octyl. The alkoxyl group for $R^{13}$ to $R^{16}$ is selected from the group consisting of methoxy, ethoxy, propoxy, isopropoxy, cyclopropyloxy, and cyclohexyloxy. The aromatic group for $R^{13}$ to $R^{16}$ is selected from the group consisting of phenyl, biphenyl, 1,2,3,4-tetrahydronaphthyl, naphthyl, anthryl, phenanthryl, and 9-fluorenyl.

It is important for achieving a sufficient mechanical property of the final cured product that the number of hydrogen atoms directly bonded to a silicon atom (the number of Si—H groups) in one molecule of the component (c) are less than 4. If the number of the Si—H groups in one molecule of the component (c) is equal to or larger than 4, cracks or delamination will occur in the cured product of the composition after dry reflow.

In the component (c) of the curable organopolysiloxane composition according to the present invention, f is from 0.1 to 0.8, preferably from 0.3 to 0.5, g is from 0.2 to 0.9, preferably from 0.3 to 0.8, more preferably form 0.4 to 0.7, h is from 0 to 0.5, preferably from 0 to 0.2, and the sum of f+g+h is 1.

In one preferred embodiment of the present invention, component (c) is selected from the group consisting of hydride terminated methylhydrosiloxane-phenylmethylsiloxane copolymers, hydride terminated polydimethylphenylsiloxanes, hydride terminated polyphenyl(dimethylsiloxy)siloxanes, hydride terminated polydiphenylsiloxanes, hydride terminated methyl hydrosiloxane-phenylmethylsiloxane copolymers, and combination thereof.

In another preferred embodiment of the present invention, the molar ratio of the hydrogen atom directly bonded to a silicon atom contained in component (c) to the alkenyl group contained in component (b) is from 0.2 to 1.2, preferably from 0.4 to 1.0.

The component (c) is preferably present in an amount of from 10 to 40%, more preferably from 15 to 35% by weight of the total weight of all components.

Component (d)

In component (d) of the curable organopolysiloxane composition according to the present invention, at least one of $R^{17}$ to $R^{21}$ is a hydrogen atom directly bonded to a silicon atom, at least one of $R^{17}$ to $R^{21}$ is an aromatic group having from 6 to 20 carbon atoms, preferably from 6 to 14 carbon atoms, more preferably phenyl, the others of $R^{17}$ to $R^{21}$ independently from each other represent an alkyl group having from 1 to 20 carbon atoms, preferably from 1 to 8 carbon atoms, and more preferably from 1 to 4 carbon atoms, such as methyl, ethyl, n-propyl, and n-butyl, or represent an alkoxy group having from 1 to 20 carbon atoms, preferably from 1 to 8 carbon atoms, and more preferably from 1 to 4 carbon atoms, such as methoxy, ethoxy, n-propoxy, and n-butoxy.

In one embodiment, the index i in the general formula of the component (d) is from 0.2 to 0.8, j is from 0.2 to 0.8, and the sum of i+j is 1.

Preferably, the component (d) is selected from the group consisting of
1,3-dimethyl-1,3-diphenyl-disilane,
3-(dimethylvinylsiloxy)-1,1,5,5-tetramethyl-3-phenyltrisiloxane,
3-(dimethylvinylsiloxy)-1,1,5,5-tetramethyl-3-methyltrisiloxane,
1,1,3,3-tetramethyl-disiloxane, 1,1,5,5-tetramethyl-3,3-diphenyltrisiloxane,
1,1,7,7-tetramethyl-3,5-diphenyltetrasiloxane,
1,1,9,9-tetramethyl-3,5,7-triphenylpentasiloxane,
1,1,11,11-tetramethyl-3,5,7,9-tetraphenylhexasiloxane,
1,1,3,3,5,5,7,7-octamethyltetrasiloxane, 1,1,3,3-tetramethyldisiloxane, and combination thereof.

In the curable organopolysiloxane composition, the component (d) is preferably present in an amount of from 1 to 25%, more preferably from 5 to 20% by weight of the total amount of all components.

In one preferred embodiment of the present invention, the molar ratio of the hydrogen atom directly bonded to a silicon atom (Si—H group) contained in components (c) and (d) to the alkenyl group (e.g. vinyl, allyl, etc) contained in components (a) and (b) is from 0.5 to 2.0, preferably from 0.8 to 1.5.

Such a range of molar ratio of the Si—H groups to the alkenyl groups will result in a good mechanical property of the final cured product. If the molar ratio is not in such range, the silicone material will easily crack and delaminate after dry reflow.

Hydrosilylation Catalyst (II)

Hydrosilylation catalyst is also add in the curable organopolysiloxane composition so that the composition can be cured under elevated temperature. According to the present invention, all catalysts which are useful for the addition of Si-bonded hydrogen onto aliphatically unsaturated compounds can be used as hydrosilylation catalyst (II). Examples of such catalysts are compounds or complexes of precious metals comprising platinum, ruthenium, iridium, rhodium and palladium, such as, for example, platinum halides, platinum-olefin complexes, platinum-alcohol complexes, platinum-alcoholate complexes, platinum-ether complexes, platinum-aldehyde complexes, platinum-ketone complexes, including reaction products of $H_2PtCl_6.6H_2O$ and cyclohexanone, platinum-vinylsiloxane complexes, in particular platinum-divinyltetramethyldisiloxane complexes with or without a content of detectable inorganically bonded halogen, bis(γ-picolin)-platinum dichloride, trimethylene-dipyridine-platinum dichloride, dicyclopentadiene-platinum dichloride, dimethylsulfoxide ethylene-platinum(II) dichloride and also reaction products of platinum tetrachloride with olefin and primary amine or secondary amine or primary and secondary amine, such as, for example, the reaction product of platinum tetrachloride dissolved in 1-octene with sec-butylamine. In addition, complexes of iridium with cyclooctadienes, such as, for example, μ-dichlorobis(cyclooctadiene)-diiridium(I), can also be used in the curable composition.

Preferably, the catalyst is a compound or complex of platinum, preferably selected from the group consisting of chloroplatinic acid, allylsiloxane-platinum complex catalyst, supported platinum catalysts, methylvinylsiloxane-platinum complex catalysts, reaction products of dicarbonyldichloroplatinum and 2,4,6-triethyl-2,4,6-trimethylcyclotrisiloxane, platinum divinyltetramethyldisiloxane complex, and the combination thereof, and most preferably platinum-divinyltetramethyldisiloxane complexes.

The hydrosilylation catalyst (II) is used for preparing the curable organopolysiloxane composition according to the present invention preferably in an amount of 0.1 to 100 ppm, and more preferably 0.5 to 50 ppm, calculated as the elemental precious metal, based on the total weight of all reactants.

Besides the components as described above, the curable organopolysiloxane composition may also optionally comprise additional components. Examples of the additional components include, but are not limited to a curing retarder, a viscosity regulating agent, an adhesion promoter, an antioxidant/thermostabilizer, a light stabilizer, a filler, a plasticizer, a dye, a pigment, a reaction inhibitor, and combination thereof.

The curing retarder may be added to the components to control the curing reaction, and may be selected from the group consisting of aliphatic unsaturated compounds, organic phosphorous compounds, organic sulfur compounds, nitrogen-containing compounds, tin compounds, organic peroxides, and combination thereof, and more preferably is selected from 2,4,6,8-tetramethyl-2,4,6,8-tetravinylcyclotetrasiloxane, 3-methyl butynol, 1-ethynylcyclohexanol, benzotiazol, tert-butyl hydroperoxide. The curing retarders which can be used for the curable organopolysiloxane composition are preferably present in an amount of from 0.1 to 1000 mols, more preferably from 1 to 50 mols per mol of the hydrosilylation catalyst (II).

Non-limiting examples of the viscosity regulating agent useful in the curable organopolysiloxane composition are linear, cyclic, network-type organopolysiloxanes, and organic solvents well known to a person skilled in the art. The specific selection of the viscosity regulating agent will depend on the practical need, and will be easily determined by a skilled artisan.

Non-limiting examples the adhesion promoter useful in the curable organopolysiloxane composition are silane coupling agents, organosilicon compounds containing SiH groups, alkenyl groups, alkoxysilyl groups and epoxy groups, isocyanurate compounds, and combination thereof, and more preferably selected from vinyltrimethoxysilane, 3-glycidoxypropyl trimethoxysilane, 3-methacryloxypropyl triethoxysilane, N-phenyl-3-aminopropyltrimethoxysilane, bis(triethoxysilylpropyl)tetrasulfide, tris-(trimethoxysilylpropyl)isocyanurate, monoallyldiglycidylisocyanurate, and combination thereof. The adhesion promoter is preferably present in an amount of from less than 10%, more preferably less than 5% by weight of all components.

The antioxidant or thermostabilizer useful in the curable organopolysiloxane composition includes but is not limited to hindered phenols, phosphites, thioethers, and the examples are tris(3,5-di-tert-butyl-4-hydroxybenzyl)isocyanurate, octadecyl 3-(3,5-di-tert-butyl-4-hydroxyphenyl)propionate, 1,3,5-trimethyl-2,4,6-tris(3,5-di-tert-butyl-4-hydroxybenzyl)benzene, tris(2,4-di-tert-butylphenyl) phosphite, 2,2'-methylenebis(4,6-di-tert-butyl-phenyl)-2-ethylhexylphosphite, 2,2-bis[[3-(dodecylthio)-1-oxopropoxy]methyl]propane-1,3-diyl, bis[3-(dodecylthio) propionate], di(tridecyl)-3,3'-thiodipropionate, and combination thereof.

If present, the antioxidant is used in the curable organopolysiloxane composition preferably in an amount of 10 to 10,000 ppm, more preferably from 100 to 1,000 ppm, based on the total amount of all components of the curable organopolysiloxane composition.

The light stabilizer useful in the curable organopolysiloxane composition includes but is not limited to hindered amine light stabilizers and ultraviolet absorbents, and the examples are 2-(5-chloro-2H-benzotriazol-2-yl)-6-tert-butyl-4-methylphenol, 2,2'-dihydroxy-4,4'-dimethoxybenzophenone, tetrakis(2,2,6,6-tetramethyl-4-piperidyl)butane-1,2,3,4-tetracarboxylate, bis(2,2,6,6-tetramethyl-4-piperidyl) sebacate, and combination thereof.

If present, the light stabilizer is preferably used in the curable organopolysiloxane composition in an amount of 10 to 10,000 ppm, more preferably from 100 to 1,000 ppm, based on the total amount of all components of the curable organopolysiloxane composition.

Fillers may also be comprised in the curable organopolysiloxane composition, and may be selected from the group consisting of finely divided silica, calcium carbonate, quartz powder, aluminum hydroxide, zirconium silicate, diatomaceous earth, titanium dioxide, and combination thereof.

If present the preferred reaction inhibitor is an α-acetylenic alcohol, and more preferably selected from the group consisting of 1-ethynyl-1-cyclopentanol; 1-ethynyl-1-cyclohexanol; 1-ethynyl-1-cycloheptanol; 1-ethynyl-1-cyclooctanol, 3-methyl-1-butyn-3-ol; 3-methyl-1-pentyn-3-ol; 3-methyl-1-hexyn-3-ol; 3-methyl-1-heptyn-3-ol; 3-methyl-1-octyn-3-ol; 3-methyl-1-nonyn-3-ol; 3-methyl-1-decyn-3-ol; 3-methyl-1-dodecyn-3-ol; 3-ethyl-1-pentyn-3-ol; 3-ethyl-1-hexyn-3-ol; 3-ethyl-1-heptyn-3-ol; 3-butyn-2-ol; 1-pentyn-3-ol; 1-hexyn-3-ol; 1-heptyn-3-ol; 5-methyl-1-hexyn-3-ol; 3,5-dimethyl-1-hexyn-3-ol; 3-isobutyl-5-methyl-1-hexyn-3-ol; 3,4,4-trimethyl-1-pentyn-3-ol; 3-ethyl-5-methyl-1-heptyn-3-ol; 4-ethyl-1-octyn-3-ol, 3,7,11-trimethyl-1-dodecyn-3-ol; 1,1-diphenyl-2-propyn-1-ol; 9-ethynyl-9-fluorenol and combination thereof.

If present, the reaction inhibitor is used in the curable organopolysiloxane composition preferably in an amount from 0.1 to 10%, more preferably from 0.5 to 5% by weight, based on the total amount of all components of the curable organopolysiloxane composition.

In one preferred embodiment of the present invention, the curable organopolysiloxane composition may comprise:
(a) 1 to 60%, more preferably 3 to 50% by weight of the component (a);
(b) 0.5 to 75%, more preferably 1 to 70% by weight of component (b);
(c) 10 to 40%, preferably 15 to 35% by weight of component (c);
(d) 1 to 25%, preferably 5 to 20% by weight of component (d);
(e) 0.1 to 100 ppm, and preferably 0.5 to 50 ppm by weight, calculated as the elemental precious metal of the hydrosilylation catalyst (II); and
(f) optionally, 0.1 to 10%, preferably from 0.5 to 5% by weight of an reaction inhibitor,
wherein the percentages by weight and ppm are based on the total weight of all components.

In another aspect, the present invention also provides a cured product obtained from the curable organopolysiloxane composition as described above.

According to the present invention, the organopolysiloxane prepolymer, the curable organopolysiloxane composition or the cured product can be used in the manufacturing of optical devices, especially light emitting materials, e.g. LEDs applied for instance in general lighting equipment, backlight of mobile phone, tablets, PC, or TV, and light source for automotive. Others uses includes coating, die attach and reflector for LED.

The cured products of the present invention provide excellent properties in heat/UV stability, mechanical property and transparency, and thus is suitable to be used as an encapsulant for LEDs.

The following examples are intended to assist one skilled in the art to better understand and practice the present invention. The scope of the invention is not limited by the examples but is defined in the appended claims. All parts and percentages are based on weight unless otherwise stated.

EXAMPLES

Materials

Triallyl isocyanurate: available from Sinopharm Chemical Reagent Co., Ltd.;

1,1,5,5-tetramethyl-3,3-diphenyl-trisiloxane: available from Gelest;

Platinum-divinyltetramethyldisiloxane complex: SIP 6832.2, 2.0-2.3% platinum concentration in cyclic methylvinylsiloxanes, CAS: 68585-32-0, available from Gelest;

$PtO_2$: available from Sinopharm Chemical Reagent Co., Ltd;

Phenyltrimethoxysilane: available from Sinopharm Chemical Reagent Co., Ltd;

Vinyldimethylethoxysilane: available from Sinopharm Chemical Reagent Co., Ltd;

Hexamethyldisiloxane: available from Sinopharm Chemical Reagent Co., Ltd;

KM-392: $[H(CH_3)_2SiO_{1/2}]_{0.67}[(Ph_2SiO_{2/2}]_{0.33}$, a hydride phenyl silicone chain extender, available from Kemi-works Company;

3,5-dimethyl-1-hexyn-3-ol: inhibitor, available from J&K Company;

MVT-154: [Vi(CH$_3$)$_2$SiO$_{1/2}$]$_{0.14}$[(CH$_3$)$_2$SiO$_{2/2}$]$_{0.48}$[(Ph$_2$SiO$_{2/2}$]$_{0.14}$[PhSiO$_{3/2}$]$_{0.24}$, a vinyl phenyl silicone resin, available from AB Silicone Company;

Syl-off 7028: [(CH$_3$)$_3$SiO$_{1/2}$]$_{0.05}$[(HCH$_3$SiO$_{2/2}$]$_{0.95}$, available from Dow Corning Company, Si—H %=16 mmol/g;

D4H: (HCH$_3$SiO)$_4$, available from J&K Company, Si—H %=16 mmol/g; and

245PT: phenyltris(dimethylsiloxy)silane, CAS: 18027-45-7, available from Sinopharm Chemical Reagent Co., Ltd.

Testing Method

The Brookfield viscosity (in Pas) was measured at 25° C. using a Brookfield DV2T digital viscometer with a spindle CPA-52Z at 1 rpm.

The Preparation of the Organopolysiloxane Prepolymer

Prepolymer 1

In a 1 L glass reactor, 134 g triallyl isocyanurate, 100.0 g 1,1,5,5-tetramethyl-3,3-diphenyl-trisiloxane, and platinum-divinyltetramethyldisiloxane complex as a catalyst with the platinum content being controlled at 100 ppm (by weight) were sufficiently stirred and mixed. The mixture was heated under 100° C. for 24 hours. The obtained prepolymer designated as prepolymer 1 was clear with Brookfield viscosity of 90 Pa·s at 25° C., and the allyl group content of the prepolymer is 4.36 mmol/g.

Prepolymer 2

In a 1 L glass reactor, 145 g triallyl isocyanurate, 100 g 1,1,5,5-tetramethyl-3,3-diphenyl-trisiloxane, and 0.5 platinum-divinyltetramethyldisiloxane complex as a catalyst with the platinum content being controlled at 50 ppm (by weight) were stirred and mixed. The mixture was heated under 150° C. for 8 hours, then filtrated it to remove PtO$_2$. The obtained prepolymer designated as prepolymer 2 was clear with Brookfield viscosity of 25 Pas at 25° C., and the allyl content of the prepolymer is 4.6 mmol/g.

The Preparation of the Component (b)—Vinyl Phenyl Silicone Resin (VPSR)

VPSR-L1

250 Kg phenyltrimethoxysilane, 64.4 Kg vinyldimethyl-ethoxysilane, 32.2 Kg hexamethyldisiloxane, 120 Kg toluene and 58 Kg 0.1M HCl aqueous solution were pumped into a 500 L glass reactor under stirring in this order. The mixture was heated by oil bath up to 65° C. and kept for 4 hours. Then the volatiles were evacuated from the mixture and a vinyl phenyl silicone resin designated as VPSR-L1 was obtained. The vinyl content of the vinyl phenyl silicone resin is 2 mmol/g.

VPSR-L2

63.72 Kg phenyltrimethoxysilane, 10.38 Kg vinyldim-ethylethoxysilane, 31.50 Kg toluene and 14.04 Kg 0.1M HCl aqueous solution were pumped into a 50 L glass reactor under stirring in this order. The mixture was heated by oil bath up to 65° C. and kept for 4 hours. Then the volatiles were evacuated from the mixture and a vinyl phenyl silicone resin designated as VPSR-L1 was obtained. The vinyl content of the vinyl phenyl silicone resin is 1.6 mmol/g.

The Preparation of the Component (c)—Hydrogen Phenyl Silicone Resin (HPSR)

HPSR-1

130 Kg phenyltrimethoxysilane, 29 Kg tetramethyldisi-lane, 47 Kg toluene and 28 Kg 0.1M HCl aqueous solution were pumped into a 500 L glass reactor under stirring in this order. The mixture was heated by oil bath up to 65° C. and kept for 4 hours. Then the volatiles were evacuated from the mixture and a vinyl phenyl silicone resin designated as HPSR-1 was obtained. The hydrogen content of the hydrogen phenyl silicone resin is 3 mmol/g.

HPSR-2

130 Kg phenyltrimethoxysilane, 18.2 Kg tetramethyldisi-lane, 13.5 Kg hexamethyldisiloxane, 47 Kg toluene and 28 Kg 0.1M HCl aqueous solution were pumped into a 500 L glass reactor under stirring in this order. The mixture was heated by oil bath up to 65° C. and kept for 4 hours. Then the volatiles were evacuated from the mixture and a vinyl phenyl silicone resin designated as HPSR-2 was obtained. The hydrogen content of the hydrogen phenyl silicone resin is 1.86 mmol/g.

The Preparation of the Curable Organopolysiloxane Composition

Example 1

11.75 g Prepolymer 1, 41.48 g VPSR-L2, 19.58 g HPSR-1, 5.50 g KM-392, 0.0071 g SIP6832.2, and 0.0805 g 3,5-dimethyl-1-hexyn-3-ol were mixed together by a DAC-300 Speedmixer manufactured by FlackTek Inc. at 1,000 rpm for 1 min and then 2,000 rpm for 2 min, and then the mixture was degassed, and cured at 80° C. for 1 h and then at 150° C. for 5 h. The ratio of Si—H groups to alkenyl groups was kept at 0.8.

Example 2

37.59 g Prepolymer 1, 0.87 g VPSR-L2, 27.40 g HPSR-1, 12.45 g KM-392, 0.0071 g SIP6832.2, and 0.0805 g 3,5-dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h. The ratio of Si—H groups to alkenyl groups was kept at 1.0.

Example 3

3.92 g Prepolymer 1, 51.59 g VPSR-L2, 11.75 g HPSR-1, 11.05 g KM-392, 0.0071 g SIP6832.2, and 0.0805 g 3,5-dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h. The ratio of Si—H groups to alkenyl groups was kept at 1.0.

Example 4

11.75 g Prepolymer 2, 37.66 g VPSR-L2, 19.58 g HPSR-1, 9.33 g KM-392, 0.0071 g SIP6832.2, and 0.0805 g 3,5-dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h. The ratio of Si—H groups to alkenyl groups was kept at 1.0.

Example 5

11.75 g Prepolymer 2, 36.29 g VPSR-L1, 19.58 g HPSR-1, 10.69 g KM-392, 0.0071 g SIP6832.2, and 0.0805 g 3,5-dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h. The ratio of Si—H groups to alkenyl groups was kept at 1.0.

Example 6

11.75 g Prepolymer 2, 33.19 g VPSR-L1, 19.58 g HPSR-1, 13.79 g KM-392, 0.0071 g SIP6832.2, and 0.0805 g 3,5-dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h. The ratio of Si—H groups to alkenyl groups was kept at 1.0.

Comparative Example 1

1.50 g triallyl isocyanurate, 71.35 g MVT-154, 4.99 g Syl-off 7028, 2.07 g 245PT, 0.0071 g SIP6832.2, and 0.0805 g 3,5-dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h.

Comparative Example 2

1.50 g triallyl isocyanurate, 71.35 g MVT-154, 4.99 g D4H, 2.07 g 245PT, 0.0071 g SIP6832.2, 0.0805 g 3,5-Dimethyl-1-hexyn-3-ol were mixed together by a Speedmixer at 1,000 rpm for 1 min and then 2,000 rpm for 2 min, and then the mixture was degassed, and cured at 80° C. for 1 h and then at 150° C. for 5 h.

Then the LED cups were placed into a hot oven at 80° C. for 1 hour and then 150° C. for 2 hours. The heated LED cups were subjected to being reflowed at around 260° C. for 3 times. After the reflow treatment, the post-reflow cracking resistance of LED cups was visually inspected for cracks and delamination.

During the initial cracking resistance, if the appearance of the LED cups encapsulated by the curable organopolysiloxane compositions in the examples was transparent, no delamination and no cracking by visual inspection, the product would be evaluated as "good". If it showed hazy, delamination or cracks, the product would be evaluated as "poor" and not suitable to be used in the manufacturing of LED cups.

During the post-reflow cracking resistance, if the appearance of the LED cups after dry reflow showed no delamination, and no more than 3 samples (20 in total) had cracks by visual inspection, the product would be evaluated as "good". If it showed delamination or more than 3 samples (20 in total) had cracks after visual inspection, the product would be evaluated as "poor" and not suitable to be used in the manufacturing of LED cups.

The above properties of Examples 1 to 6 and Comparative Examples 1 and 2 were tested, and the results are summarized in Table 1.

TABLE 1

| Test Item | Example 1 | Example 2 | Example 3 | Example 4 | Example 5 | Example 6 | Comparative example 1 | Comparative Example 2 |
|---|---|---|---|---|---|---|---|---|
| Transparency @400 nm (initial) | 88% | 88% | 89% | 88% | 88% | 88% | 89% | 89% |
| Transparency @400 nm (at 150° C. for 1000 h) | 84% | 85% | 84% | 83% | 84% | 83% | 84% | 83% |
| Initial cracking resistance | good | Good | good | good | good | good | poor (hazy) | good |
| Post-reflow cracking resistance (cracked/total) | No delamination 0/20* | No delamination 1/20 | No delamination 0/20 | No delamination 0/20 | No delamination 2/20 | No delamination 1/20 | No delamination 10/20 | No delamination 5/20 |

Cracked/total: the number of cracked LED cups to the total number of the tested LED cups. For example 0/20 means that none of 20 tested LED cups in total was found cracking during the test.

Evaluation
Testing Methods:

The initial transparency and aged transparency (at 150° C. for 1000 h) were measured by an UV-Visible spectrum analyzer Lambda 650S manufactured by PerkinElmer Corporation. The transmittance was measured for the range from 300 nm to 800 nm, and the value at 400 nm was recorded as the transparency.

The cracking and delamination resistance was measured by the method described as below:

LED cups with type 3528 commercially available from Boluo Leadframe Company were first placed into a hot oven at 100° C. for 2 hours, and then the heated LED cups were treated by plasma using PDC-210 plasma cleaner under 50 W for 30 seconds.

The products of Examples 1 to 6 and Comparative Examples 1 and 2 were dropped into 20 LED cups prepared above for each example via a dispenser (Nordson Company, EFD Ultimus I). The initial cracking resistance of LED cups was visually inspected for cracks and delamination.

As shown in Table 1, all of the cured products prepared from Examples 1 to 6 exhibited excellent performance in both initial and aged transparency, initial cracking resistance and post-reflow cracking resistance.

Also, it can be found in Table 1 that the cured product prepared from Comparative Example 1 did not possess either a good initial cracking (haziness) or a good post-reflow cracking resistance (10 of 20 LED cups cracked). The products from Comparative Example 2 exhibited an unsatisfactory post-reflow cracking resistance since 5 of 20 LED cups were cracking after the reflow treatment, although other properties of the products were acceptable.

Therefore, it was demonstrated that the preparation of the organopolysiloxane prepolymer according to the present invention facilitated to the performance of cured encapsulants and in turn improved the properties of the LED cups.

It is also believed that the use of the branched polyorganohydrogensiloxane having 1 to 3 Si—H groups in one molecule for the curable organopolysiloxane composition contributed to the excellent performance of the cured product encapsulating the LED cups. As shown in the comparative examples, the compositions containing a component having 4 or more Si—H groups in one molecule deteriorated the mechanical properties of the cured products.

These and other modifications and variations of the present invention may be practiced by those of ordinary skill in the art, without departing from the spirit and scope of the present invention. In addition, it should be understood that aspects of the various embodiments may be interchanged both in whole or in component. Furthermore, those of ordinary skill in the art will appreciate that the foregoing description is by way of example only, and is not intended to limit the invention so further described in such appended claims.

What is claimed is:

1. A curable organopolysiloxane composition, comprising:
   (a) an organopolysiloxane prepolymer being a reaction product of reactants comprising:
      (1) a cyclic isocyanurate having two or more ethylenically unsaturated double bonds which is represented by formula (1)

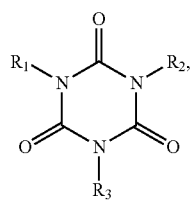

(1)

wherein
   $R^1$, $R^2$ and $R^3$ independently from each other represent an alkyl group having from 1 to 20 carbon atoms, an aromatic group having from 6 to 20 carbon atoms, a monovalent organic group represented by —$(CH_2)_m$—X or —$(CH_2)_p$—O—$(CH_2)_q$—Y, in which m is from 0 to 3, p is from 0 to 3, q is from 0 to 3, X and Y are selected from the group consisting of an alkenyl group having from 2 to 20 carbon atoms, an epoxy group having from 2 to 20 carbon atoms, and a trialkoxysilyl group having from 1 to 20 carbon atoms independently for each alkoxy group; and
   at least two of $R^1$, $R^2$ and $R^3$ contain an ethylenically unsaturated double bond,
   (2) a linear organohydroqensiloxane having at least one hydrogen atom directly bonded to a silicon atom in one molecule, represented by the average compositional formula (2):

$$R^4R^5R^6SiO_{1/2})_a(R^7R^8SiO_{2/2})_b \qquad (2),$$

wherein
   at least one of $R^4$ to $R^8$ is a hydrogen atom directly bonded to a silicon atom, at least one of $R^4$ to $R^8$ is an aromatic group having from 6 to 20 carbon atoms, the others of $R^4$ to $R^8$ independently from each other represent an alkyl group having from 1 to 20 carbon atoms or an alkoxy group having from 1 to 20 carbon atoms, a is from 0.1 to 0.9, b is from 0.1 to 0.9, and the sum of a+b is 1; and
   (3) an hydrosilylation catalyst (I),
wherein the molar ratio of the ethylenically unsaturated double bonds contained in component (a) to the hydrogen atom directly bonded to a silicon atom contained in component (b) is from 2.2 to 5.0,
   (b) an organopolysiloxane comprising at least two ethylenically unsaturated double bonds in one molecule represented by the average compositional formula (3):

$$(R^9R^{10}R^{11}SiO_{1/2})_c(R^{12}SiO_{3/2})_d(SiO_{4/2})_e \qquad (3)$$

wherein
   at least one of $R^9$ to $R^{12}$ is an alkenyl group having from 2 to 20 carbon atoms, at least one of $R^9$ to $R^{12}$ is an aromatic group having from 6 to 20 carbon atoms, the others of $R^9$ to $R^{12}$ independently from each other represent an alkyl group having from 1 to 20 carbon atoms or an alkoxy group having from 1 to 20 carbon atoms, from 15 to 65 mol % of $R^9$ to $R^{12}$ in one molecule of the organopolysiloxane are an aromatic group having from 6 to 20 carbon atoms, from 1 to 50 mol % of $R^9$ to $R^{12}$ in one molecule of the organopolysiloxane are an alkenyl group having from 2 to 20 carbon atoms, and the total mol % of $R^9$ to $R^{12}$ in one molecule of the organopolysiloxane is 100 mol %,
   c is from 0.1 to 0.8, d is from 0.2 to 0.9, e is from 0 to 0.2, and the sum of c+d+e is 1,
   (c) a branched polyorganohydrogensiloxane having 1 to 3 hydrogen atoms directly bonded to a silicon atom in one molecule represented by the average compositional formula (4):

$$(R^{13}R^{14}R^{15}SiO_{1/2})_f(R^{16}SiO_{3/2})_g(SiO_{4/2})_h \qquad (4)$$

wherein
   at least one of $R^{13}$ to $R^{16}$ is a hydrogen atom directly bonded to a silicon atom, at least one of $R^{13}$ to $R^{16}$ is an aromatic group having from 6 to 20 carbon atoms, the others of $R^{13}$ to $R^{16}$ independently from each other represent an alkyl group having from 1 to 20 carbon atoms or an alkoxy group having from 1 to 20 carbon atoms, f is from 0.1 to 0.8, g is from 0.2 to 0.9, h is from 0 to 0.5, and the sum of f+g+h is 1;
   (d) a linear organohydrogensiloxane having at least one hydrogen atom directly bonded to a silicon atom in one molecule, represented by the average compositional formula (5):

$$(R^{17}R^{18}R^{19}SiO_{1/2})_i(R^{20}R^{21}SiO_{2/2})_j \qquad (5),$$

wherein
   at least one of $R^{17}$ to $R^{21}$ is a hydrogen atom directly bonded to a silicon atom, at least one of $R^{17}$ to $R^{21}$ is an aromatic group having from 6 to 20 carbon atoms, the others of $R^{17}$ to $R^{21}$ independently from each other represent an alkyl group having from 1 to 20 carbon atoms or an alkoxy group having from 1 to 20 carbon atoms, i is from 0.1 to 0.9, j is from 0.1 to 0.9, and the sum of i+j is 1, and
   (e) a hydrosilylation catalyst (II).

2. The curable organopolysiloxane composition according to claim 1, wherein component (a) is present in an amount of from 5 to 25% by weight of the total weight of all components.

3. The curable organopolysiloxane composition according to claim 1, wherein from 20 to 50 mol % of $R^9$ to $R^{12}$ in one molecule of component (b) is an aromatic group having from 6 to 20 carbon atoms.

4. The curable organopolysiloxane composition according to claim 1, wherein from 5 to 30 mol % of $R^9$ to $R^{12}$ in one molecule of component (b) is alkenyl group having from 2 to 20 carbon atoms.

5. The curable organopolysiloxane composition according to claim 1, wherein component (b) is present in an amount of from 5 to 80% by weight of the total weight of all components.

6. The curable organopolysiloxane composition according to claim 1, wherein the component (c) is present in an amount of from 1 to 50% by weight of the total weight of all components.

7. The curable organopolysiloxane composition according to claim 1, wherein in component (d), i is a positive number of from 0.2 to 0.6, j is a positive number of from 0.4 to 0.8, and the sum of i+j is 1.

8. The curable organopolysiloxane composition according to claim 1, wherein the molar ratio of the hydrogen atom directly bonded to a silicon atom contained in component (d) to the alkenyl group contained in component (b) is from 0.5 to 1.2.

9. The curable organopolysiloxane composition according to claim 1, wherein the amount of component (d) is from 1 to 40% by weight of the total amount of all components.

10. An optical device comprising the curable organopolysiloxane composition according to claim 1.

11. A cured product of the curable organopolysiloxane composition according to claim 1.

12. A light emitting material comprising the cured product according to claim 11.

13. An optical device comprising the cured product according to claim 11.

\* \* \* \* \*

UNITED STATES PATENT AND TRADEMARK OFFICE
CERTIFICATE OF CORRECTION

PATENT NO. : 9,994,681 B2
APPLICATION NO. : 15/647648
DATED : June 12, 2018
INVENTOR(S) : Hao Wu et al.

Page 1 of 1

It is certified that error appears in the above-identified patent and that said Letters Patent is hereby corrected as shown below:

In the Specification

Column 5, Line 51, change "SO4/2" to -- SiO4/2 --

Column 10, Line 37, change "f+g+h is" to -- f+g+h is 1 --

Signed and Sealed this
Nineteenth Day of March, 2019

Andrei Iancu
*Director of the United States Patent and Trademark Office*